United States Patent
Ho

(10) Patent No.: US 6,809,603 B1
(45) Date of Patent: Oct. 26, 2004

(54) RING OSCILLATOR HAVING A STABLE OUTPUT SIGNAL WITHOUT INFLUENCE OF MOS DEVICES

(75) Inventor: Chien-Hung Ho, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/249,679

(22) Filed: Apr. 29, 2003

(51) Int. Cl.⁷ .............................................. H03B 27/00
(52) U.S. Cl. ...................... 331/57; 331/175; 331/176; 331/185
(58) Field of Search ..................... 331/175, 57, 176, 331/185

(56) References Cited

U.S. PATENT DOCUMENTS 5,285,173 A * 2/1994 Reynolds ..................... 331/57

6,664,861 B2 * 12/2003 Murakami ................... 331/57

* cited by examiner

Primary Examiner—Arnold Kinkead
(74) Attorney, Agent, or Firm—Winston Hsu

(57) ABSTRACT

A ring oscillator having a stable output signal without influence of MOS devices is disclosed. The ring-oscillator has a bias circuit to drive a plurality of delay cells. The bias circuit has a first loading unit with a p-n junction, a second loading unit with a p-n junction, and a resistor electrically connected to the p-n junction of the second loading unit. The second loading unit and the resistor are positioned at a current path of a current mirror, and the first loading unit is positioned at another current path of the current mirror. The area of the p-n junction in the second loading unit is not equal to the area of the p-n junction in the first loading unit. The magnitudes of the current passing on the two current paths are only controlled by characteristics of the p-n junctions of the first and second loading units.

22 Claims, 8 Drawing Sheets

RING OSCILLATOR HAVING A STABLE OUTPUT SIGNAL WITHOUT INFLUENCE OF MOS DEVICES

BACKGROUND OF INVENTION

1. Field of the Invention

The present invention relates to a ring oscillator. In particular, the present invention discloses a ring oscillator whose output signal is not affected by the characteristics of MOS devices.

2. Description of the Prior Art

In modern information society, a digital system capable of processing digital data needs a clock signal to arbitrate and coordinate timings associated with processing and transmission of the digital data. Therefore, an oscillator used to generate the required clock signal becomes a fundamental component in a modern digital circuit. In addition, a phase lock loop (PLL) of signal processing circuits used in a general communication system, an optical disk drive, and a hard-disk drive commonly applies a voltage-controlled oscillator (VCO). That is, voltages are used to control a voltage-controlled oscillator to make the clock signal have a specific period or a specific frequency. With the improvement of transmission and processing speeds for digital signals, it becomes an important issue to manufacture oscillators that are capable of generating high-frequency (short period) clock signals.

Please refer to FIG. 1, which is a diagram of a prior art ring oscillator 10. The ring oscillator 10 has a plurality of delay cells cascaded to form a closed loop. Please note that only three delay cells 12a, 12b, 12c are shown in FIG. 1 for simplicity. Operation of the delay cells 12a, 12b, 12c are similar to that of an inverter, and functionality of the delay cells 12a, 12b, 12c are to make input ports IP1, IP2, IP3 and related output ports OP1, OP2, OP3 correspond to opposite voltage levels. For example, when the input port IP1 corresponds to a high voltage level, the corresponding output port OP1 corresponds to a low voltage level; on the other hand, when the input port IP1 corresponds to the low voltage level, the corresponding output port OP1 corresponds to the high voltage level.

Operation of the ring oscillator 10 is described as follows. When the input port IP1 of the delay cell 12a corresponds to the high voltage level, the output port OP1 of the delay cell 12a corresponds to the low voltage level. Because the output port OP1 of the delay cell 12a is electrically connected to input port IP2 of the following delay cell 12b, the input port IP2 of the delay cell 12b, therefore, corresponds to the low voltage level. The output port OP2 of the delay cell 12b then corresponds to the high voltage level. Similarly, because output port OP2 of the delay cell 12b is electrically connected to input port IP3 of the following delay cell 12c, the input port IP3 of the delay cell 12c corresponds to the high voltage level for driving output port OP3 of the delay cell 12c to correspond to the low voltage level.

It is noteworthy that output port OP3 of the delay cell 12c is electrically connected to the input port IP1 of the delay cell 12a, and the input port IP1 initially corresponds to the high voltage level. However, the closed loop formed by the delay cells 12a, 12b, 12c forces the input port IP1 of the delay cell 12a to correspond to the low voltage level after the delay cells 12a, 12b, 12c sequentially operate. After input port of each delay cell 12a, 12b, 12c receives an input signal, the corresponding delay cell requires a delay time Td to generate an output signal having a voltage level opposite to that of the input signal. Therefore, voltage level at the output port and input port of each delay cell 12a, 12b, 12c has a level transition every three delay time 3*Td.

The level transition means that the voltage level transits from the original high voltage level to the low voltage level or the voltage level transits from the original low voltage level to the high voltage level. In other words, the period of the clock signal F0 generated from the ring oscillator 10 becomes 6*Td. In addition, the control voltage Vc is used to adjust the delay time of each delay cell 12a, 12b, 12c. Therefore, period of the clock signal F0 is controllable with the adjustment of the voltage value of the control voltage Vc.

Please refer to FIG. 2, which is a diagram of the delay cell 12a shown in FIG. 1. The delay cell 12a includes a plurality of p-channel metal oxide semiconductor (PMOS) transistors 14a, 14b, and a plurality of n-channel metal oxide semiconductor (NMOS) transistors 16a, 16b. The transistors 14a, 14b, 16a, 16b are fabricated according to a CMOS semiconductor process. The transistors 14a, 16a are matched to correspond to the same transistor characteristics such as an identical doping concentration, an identical channel width/length ratio, etc. In addition, the transistors 14b, 16b are matched as well.

The transistors 14a, 16a function as current sources. That is, the transistors 14a, 16a operate in a saturation region. Therefore, when a control voltage $V_{c1}$ is inputted into a gate of the transistor 14a, a fixed reference current I1 flowing from a voltage source Vdd (high voltage level) toward the transistor 14b is generated. Similarly, when a control voltage $V_{c2}$ is inputted into a gate of the transistor 16a, a fixed reference current I2 flowing from the transistor 16b toward a voltage source Vss (low voltage level) is generated.

Operation of the delay cell 12a is briefly described as follows. If the input port IP1 corresponds to a high voltage level, the transistor 16b is turned on, and the transistor 14b is turned off. Therefore, the reference current I2 starts discharging the output port OP1 to make the output port OP1 correspond to the low voltage level.

As mentioned above, when the delay cell 12c operates, the level transition occurs at the input port IP1 of the delay cell 12a. Therefore, after the voltage level of the input port IP1 transits from the high voltage level to the low voltage level, the transistor 14b is turned on, and the transistor 16b is then turned off. The reference current I1, therefore, begins charging the output port OP1 to make the output port OP1 correspond to the high voltage level. In other words, the transistors 14b, 16b function as switches used to determine that the output port OP1 needs to be charged or discharged according to the voltage level of the input port IP1. Then, the voltage levels of the output port OP1 and the input port IP1 correspond to opposite voltage levels.

In addition, the magnitudes of the reference currents I1, I2 affect the delay time Td of the delay cell 12a. If the reference current I1 is increased, the reference current I1 raises the voltage level of the output port OP1 much quicker. Similarly, if the reference current I2 is increased, the reference current I2 decreases voltage level of the output port OP1 much quicker. Please note that the magnitudes of the reference currents I1, I2 are dominated by the control voltages $V_{c1}$, $V_{c2}$. As shown in FIG. 1, the control voltage Vc generating the control voltages $V_{c1}$, $V_{c2}$ is then capable of adjusting the delay time Td to alter period of the clock signal F0.

However, with regard to the transistors 14a, 16a, the transistor characteristics varies with the operating temperature, voltage sources Vdd, Vss, etc. For instance, when the operating temperature increases, mobility of electrons in the transistors 14a, 16a is suppressed. Therefore, under the same gate-to-source bias, current values of the reference currents I1, I2 decrease owing to an increase of the operating temperature. On the other hand, when the operating temperature decreases, mobility of the electrons in the transistors 14a, 16a is improved. Therefore, under the same gate-to-source bias, current values of the reference currents I1, I2 increase owing to a decrease of the operating temperature. In other words, if the operating temperature varies randomly, the period of the clock signal F0 accordingly becomes unstable. That is, the frequency of the clock signal F0 deviates from an ideal target value. Besides, the unstable voltages provided by the voltage sources Vdd, Vss alter gate-to-source biases of the transistors 14a, 16a so that the magnitudes of the reference currents I1, I2 varies. Similarly, the period of the clock signal F0 varies accordingly and deviates from the ideal target value. To sum up, transistor characteristics of the transistors influence the frequency of the clock signal F0 so that the clock signal F0 becomes unstable.

SUMMARY OF INVENTION

It is therefore a primary objective of this invention to provide a ring oscillator whose output signal is not affected by transistor characteristics of MOS devices.

Briefly summarized, the preferred embodiment of the claimed invention discloses a bias circuit of a ring oscillator for driving the ring oscillator to output a clock signal with a predetermined period. The ring oscillator has a plurality of delay cells. Each two adjacent delay cells are cascaded in series with an output port of a leading delay cell and an input port of a following delay cell being connected. An input port of a first delay cell within the delay cells is electrically connected to an output port of a last delay cell within the delay cells.

Each delay cell includes a first driving transistor for outputting a first bias current to drive a voltage at an output port of the delay cell to correspond to a first logic level, a second driving transistor for outputting a second bias current to drive the voltage at the output port of the delay cell to correspond to a second logic level, and a switch circuit electrically connected to the first driving transistor and the second driving transistor for deciding whether the output port of the delay cell is electrically connected to either the first driving transistor or the second driving transistor according to a voltage at an input port of the delay cell.

The bias circuit has a first loading unit including a p-n junction and a second loading unit including a p-n junction where the area of the p-n junction of the second loading unit is not equal to the area of the p-n junction of the first loading unit, a first reference circuit, a resistor electrically connected between the p-n junction of the second loading unit and a second current mirror circuit, and a second reference circuit electrically connected to the first reference circuit for establishing a current mirror connection used to make a current transmitted by the second reference circuit and the currents transmitted by the first current mirror and the second current mirror circuit correspond to a first predetermined ratio.

The first reference circuit has the first current mirror circuit electrically connected to the p-n junction of the first loading unit, and the second current mirror circuit symmetric to the first current mirror circuit. The second current mirror is electrically connected to the first current mirror circuit for establishing a current mirror connection used to make the first current mirror circuit and the second current mirror circuit respectively transmit currents with an identical current value to drive the corresponding first loading unit and the second loading unit. The first reference circuit is electrically connected to the first driving transistor of each delay cell for establishing a current mirror used to make the first bias current and the currents transmitted by the first current mirror and the second current mirror circuit correspond to a second predetermined ratio. The second reference circuit is electrically connected to the second driving transistor of each delay cell for establishing a current mirror used to make the second bias current and the currents transmitted by the first current mirror and the second current mirror circuit correspond to a third predetermined ratio.

It is an advantage of the present invention that the claimed ring oscillator makes use of the intrinsic band gap associated with a p-n junction to control a bias current. The claimed ring oscillator adopts either two diodes or two BJTs whose p-n junctions correspond to different areas, and then generates the bias current through different voltage difference caused by the unmatched p-n junctions. In addition, a resistor having a positive temperature coefficient is also utilized to compensate variation of the bias current caused by an unsteady temperature. The claimed ring oscillator then utilizes the bias current and established current mirror connection to provide each delay cell with a desired reference current. Therefore, the reference current is fixed even though transistor characteristics of any MOS transistor within the claimed ring oscillator is unsteady. In other words, the claimed ring oscillator is capable of outputting a stable clock signal.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
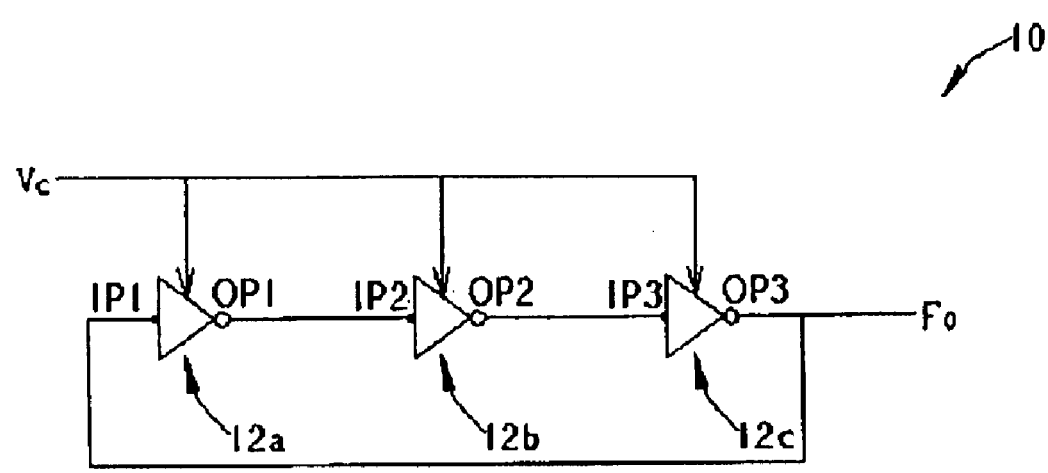
FIG. 1 is a diagram of a prior art ring oscillator.
Figure 2:
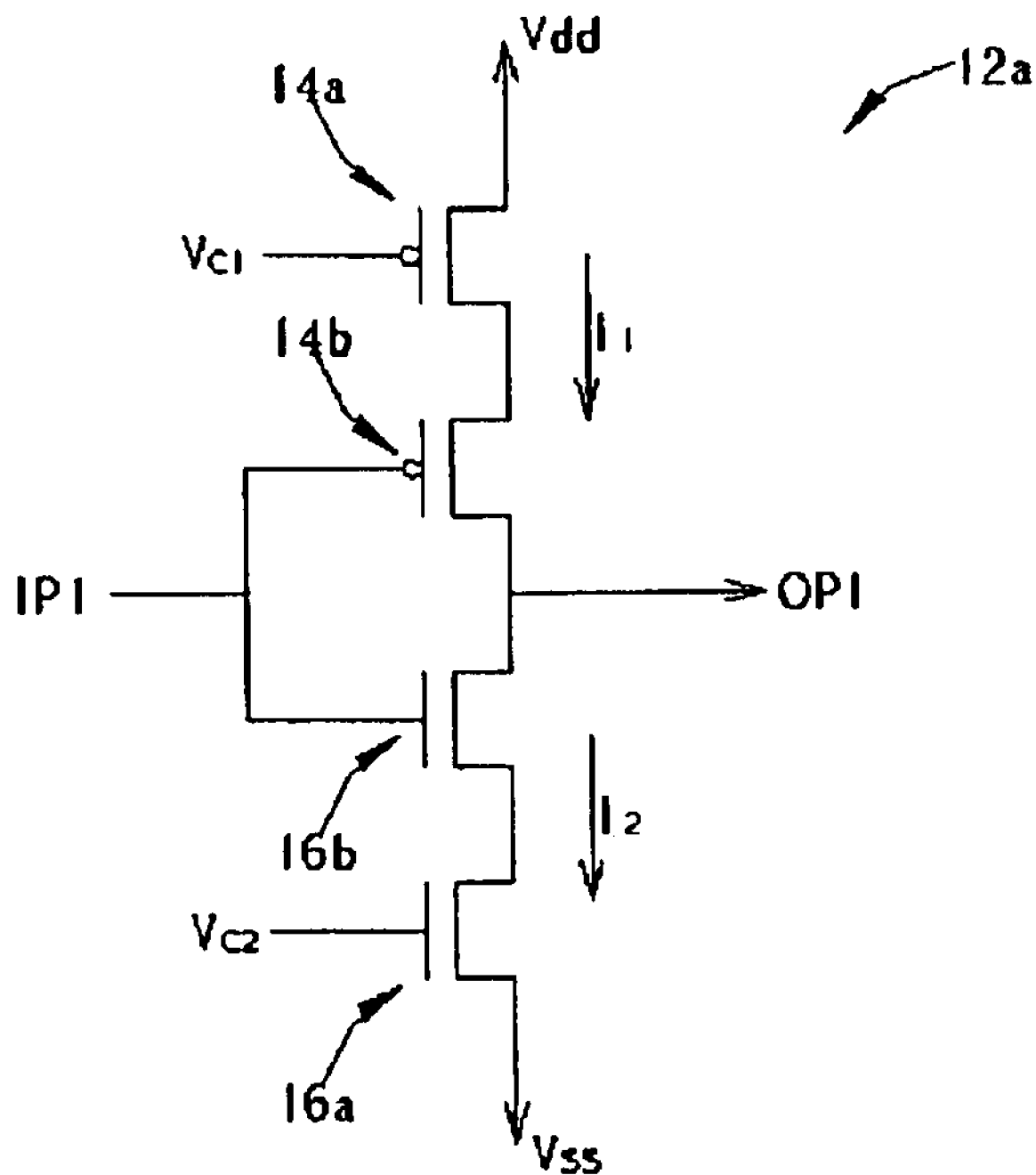
FIG. 2 is a diagram of a delay cell shown in FIG. 1.
Figure 3:
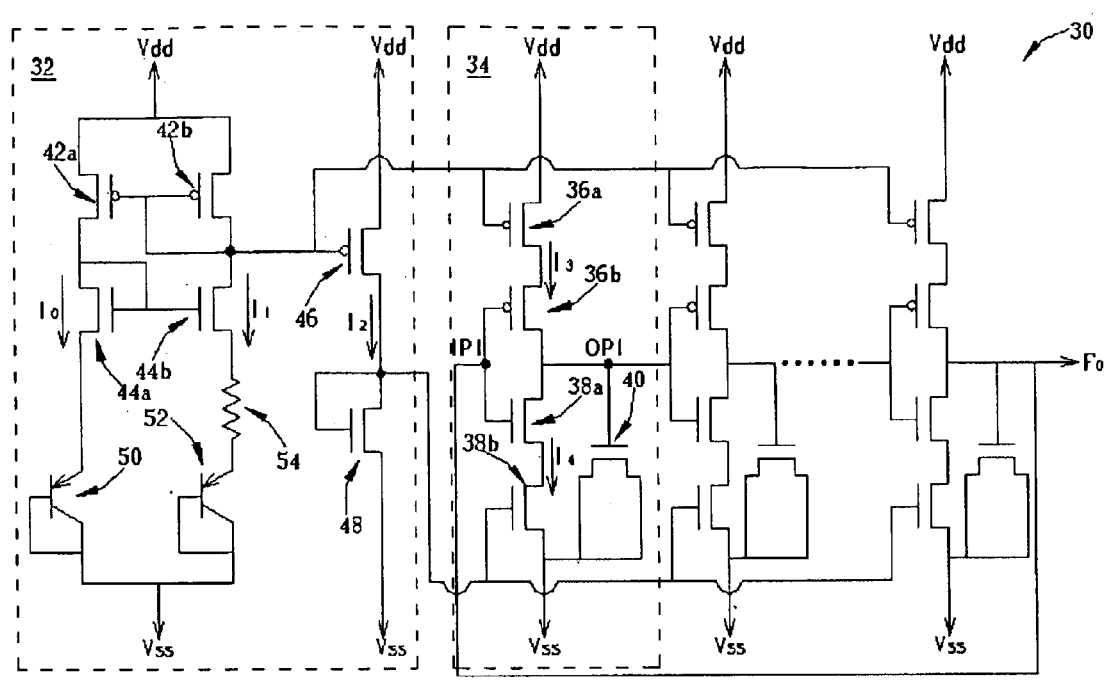
FIG. 3 is a circuit diagram of a ring oscillator according to the present invention.

Please refer to FIG. 3, which is a circuit diagram of a ring oscillator 30 according to the present invention. The ring oscillator 30 has a bias circuit 32 and a plurality of delay cells 34. The delay cells 34 are cascaded to form a closed loop. The delay cell 34 includes a plurality of transistors 36a, 36b, 38a, 38b, 40. The transistors 36a, 36b are PMOS transistors and the transistors 38a, 38b, 40 are NMOS transistors. A source and drain of the transistor 40 are connected together. Because an oxide layer is positioned between the gate and the source and is positioned between the gate and the drain, the functionality of the transistor 40, therefore, is equivalent to a capacitor.

The bias circuit 32 has a plurality of transistors 42a, 42b, 44a, 44b, 46, 48, two bipolar junction transistors (BJTs) 50, 52, and a resistor 54. In the preferred embodiment, all of the transistors 42a, 42b, 44a, 44b, 46, 48 operate in the saturation region. The transistors 42a, 42b are matched to correspond to identical transistor characteristics, and the transistors 44a, 44b are matched as well to correspond to identical transistors. The gate of the transistor 44a is electrically connected to the drain of the transistor 44a and the gate of the transistor 44b. Therefore, a current mirror is established. Similarly, the transistors 42a, 42b, 46 are connected according to a current mirror connection. In addition, each delay cell 34 and the bias circuit are connected according to the current mirror connections as well. For example, the connection between the transistors 36a, 42b and the connection between the transistors 38b, 48 establish well-known current mirrors.

Operation of the bias circuit 32 is described as follows. In the preferred embodiment, BJTs 50, 52 are p-n-p BJTs. A p-n junction between an emitter and a base of the BJT 50 and a p-n junction between an emitter and a base of the BJT 52 correspond to different areas. Therefore, a voltage difference $V_{be}$ between the emitter and the base of the BJT 50 is different from a voltage difference $V_{be}$ between the emitter and the base of the BJT 52 because the area of the p-n junction associated with the emitter and base of the BJT 50 is less than the area of the p-n junction associated with emitter and base of the BJT 52. As a result, when both BJTs 50, 52 are enabled to conduct currents with the same magnitude, a voltage difference $V_{be}$ of the BJT 50 is greater than a voltage difference $V_{be}$ of the BJT 52.

The transistors 44a, 44b are matched, and are connected according to the current mirror connection. In addition, the transistors 44a, 44b operate in the saturation region. Therefore, based on an equation (1) represented by $$Id = Kn(Vgs - Vn)^2 \qquad \text{Equation (1)}$$

where Id is a conducting current, Kn is a conduction parameter, Vgs is a voltage difference between the gate and the source, and Vt is a threshold voltage, $Vgs_{(44a)}$ is equal to $Vgs_{(44b)}$ when the reference current I0 equals the reference current I1. Because the gate of the transistor 44a is electrically connected to the gate of the transistor 44b, $Vg_{(44a)}$ is equal to $Vg_{(44b)}$. In other words, voltages associated with the sources of the transistors 44a, 44b are equal. That is, $Vs_{(44a)}$ is equal to $Vs_{(44b)}$.

Collectors of the BJTs 50, 52 are simultaneously connected to voltage source Vss (low voltage level). Therefore, a voltage difference $Vbe_{(50)}$ is equal to the summation of the voltage difference $Vbe_{(52)}$ of the transistor 52 and a voltage difference between two terminals of the resistor 54 whose resistance equals R. Consequently, an equation (2) is represented by the following.

$$Vbe_{(50)} = Vbe_{(52)} + I*R \qquad \text{Equation (2)}$$

It is well-known that voltage difference Vbe of the prior art BJT is equal to $Vt*\ln(I/Is)$. The Is is saturation current that is an intrinsic characteristic of the BJT, and is proportional to the area of the p-n junction associated with an emitter and a base of the BJT. The Vt is a thermal voltage generally represented by $$\frac{k*T}{q},$$

wherein k is a Boltzmann's constant, T is an absolute temperature, and q is the coulomb of an electron. Therefore, the thermal voltage Vt changes according to variation of the temperature. The equation (2) is fiber represented by an equation (3).

$$Vt*\ln(I/Is_1) = Vt*\ln(I/Is_2) + I*R \qquad \text{Equation (3)}$$

The $Is_1$ and $Is_2$ respectively are saturation currents of the BJTs 50, 52. The thermal voltage Vt is capable of being represented by $$\frac{k*T}{q},$$

and the resistance of the resistor 54 is capable of being represented by $R*(1+Tc*T)$ wherein Tc is a temperature coefficient of the resistor 54.

It is obvious that if Tc is a positive value, the resistor 54 corresponding to a positive temperature coefficient increases its resistance when the operating temperature of the resistor 54 increases. Similarly, if Tc is a negative value, the resistor 54 corresponding to a negative temperature coefficient decreases its resistance when the operating temperature of the resistor 54 increases. The equation (3) is further rearranged to produce an equation (4).

$$I = \frac{\left[\left(\frac{k*T}{q}\right)*\ln\left(\frac{Is2}{Is1}\right)\right]}{R(1+Tc*T)} \qquad \text{Equation (4)}$$

It is obviously shown in equation (4) that a current value I of each reference current I0, I1 is affected by the temperature T. In the preferred embodiment, the resistor 54 with a positive temperature coefficient is adopted, and is capable of compensating deviation of the thermal voltage Vt influenced by temperature variation. For example, when the temperature T increases, the thermal voltage Vt accordingly increases. At the same time, resistance of the resistor 54 is increased owing to an increase in the temperature. An actual variation of the current value I is alleviated because of compensation introduced by the resistor 54. Similarly, when the temperature T decreases, the thermal voltage Vt accordingly decreases. At the same time, resistance of the resistor 54 is decreased owing to the decrease in the temperature. The actual variation of the current value I is also alleviated because of compensation introduced by the resistor 54. To sum up, the preferred embodiment is capable of outputting a stable current value I.

Because the transistor 46 and the transistor 42b is electrically connected according to the current mirror connection, the reference current I1 and the reference current I2 correspond to a predetermined ratio. For instance, if the transistors 46, 42b are matched to have the same transistor characteristics, the magnitude of the reference current I2 is identical to the magnitude of the reference current I1. On the other hand, if the channel width/length ratio of the transistor 46 is a double of the channel width/length ratio of the transistor 42b, the magnitude of the reference current I2 is twice as great as the magnitude of the reference current I1. Besides, the transistor 38b of the delay cell 34 and the transistor 48 of the bias circuit 32 are also electrically connected according to the current mirror connection. As mentioned above, the transistor characteristics of both of the transistors 38b, 48 determine a ratio relation between the magnitudes of two reference currents I2, I4. Similarly, the transistor 36a of the delay cell 34 and the transistor 42b of the bias circuit 32 are also electrically connected according to the current mirror connection.

As mentioned above, transistor characteristics of both of the transistors 36a, 42b determine a ratio relationship between the magnitudes of the two reference currents I1, I3. Because the transistors 36a, 38b of the delay cell 34 operate in the saturation region, the transistors 36a, 38b are capable of functioning as current sources to respectively provide the reference currents I3, I4. As described above, the magnitude of the reference current I3 is controlled by the magnitude of the reference current I1. In addition, the magnitude of the reference current I4 is controlled by the magnitude of the reference current I2, and the magnitude of the reference current I2 is further controlled by the magnitude of the reference current I1.

In other words, a current value I of each reference current I1, I0 dominates the magnitudes of the reference currents I3, I4. As shown in the equation (4), the current value I merely changes according to the operating temperature, and the current value I is not influenced by an input/output voltage variation or an intrinsic transistor characteristic of each MOS transistors used in the ring oscillator 30. The current value I is stabilized owing to compensation caused by the resistor 54. The reference currents I3, I4 are fixed even though the transistors 36a, 38b in the delay cell 34 may have variations on the transistor characteristics such as an increase or a decrease of the electron mobility. Besides, the reference currents I3, I4 are also fixed even though voltage levels respectively maintained by the voltage sources Vdd, Vss of the ring oscillator 30 become unstable.

When the input port IP1 corresponds to the high voltage level, the transistor 38a is switched on. Therefore, charges accumulated at the gate of the transistor 40 are driven to the voltage source Vss (low voltage level) through the reference current I4. The output port OP1 then corresponds to the low voltage level. On the other hand, when the input port IP1 corresponds to the low voltage level, the transistor 38b is switched on. Therefore, the gate of the transistor 40 is charged by the voltage source Vdd (high voltage level) through the reference current I3 to accumulate charges. The output port OP1 then corresponds to the high voltage level. It is noteworthy that magnitude of the reference currents I3, I4 is not influenced by transistor characteristics of the MOS transistors. Therefore, the delay time corresponding to each delay cell 34 is a fixed value so that the clock signal F0 generated from the ring oscillator 30 steadily corresponds to a predetermined frequency.

Figure 4:
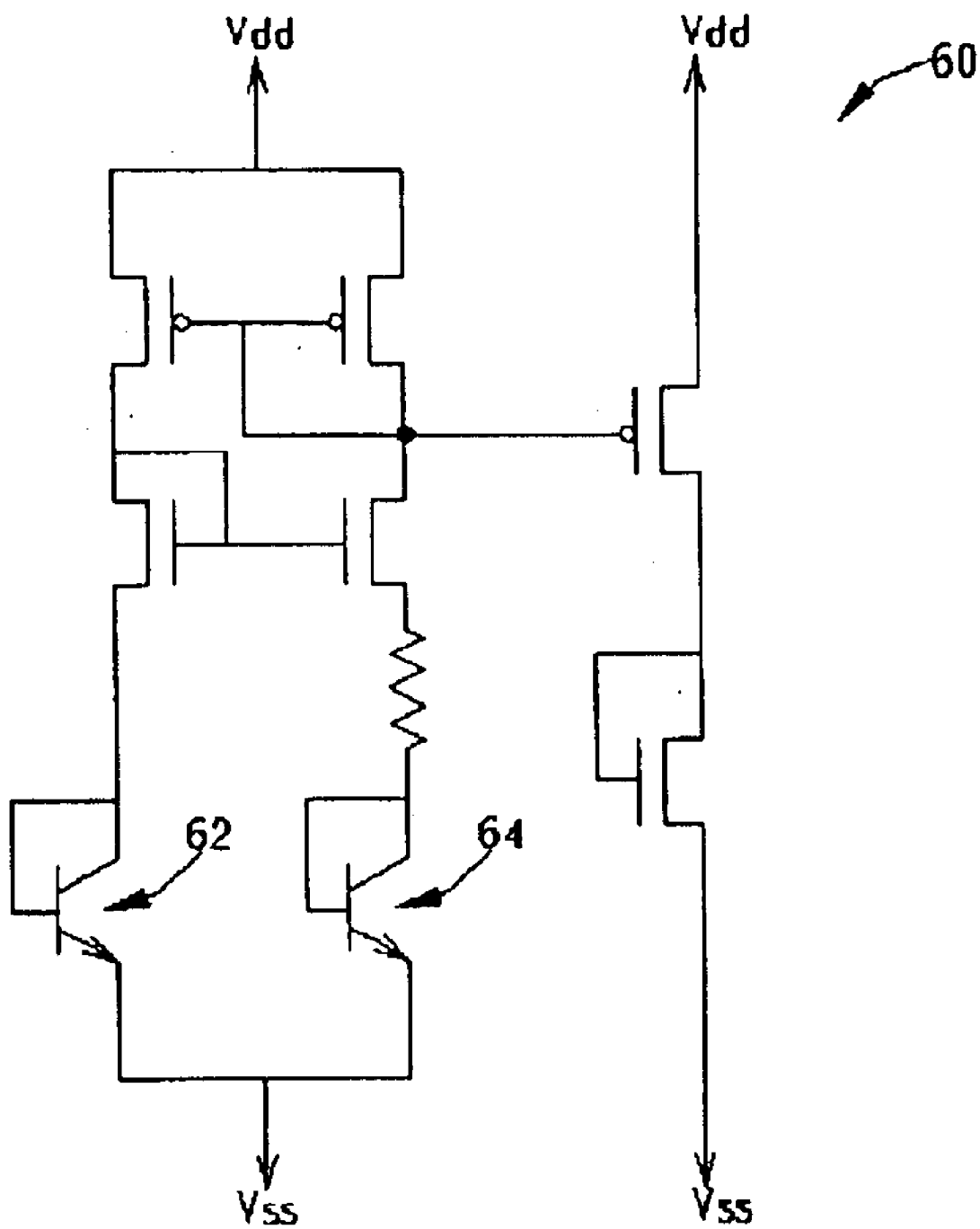
FIG. 4 is a diagram illustrating a first equivalent circuit of a bias circuit shown in FIG. 3.

Please refer to FIG. 4~FIG. 8. FIG. 4~FIG. 8 are diagrams illustrating equivalent circuits of the bias circuit 32 shown in FIG. 3. A bias circuit 60 shown in FIG. 4 is similar to the bias circuit 32 shown in FIG. 3. The only difference is that the bias circuit 60 adopts n-p-n BJTs 62, 64 to substitute p-n-p BJTs 50, 52 originally used in the bias circuit 32. The area associated with a p-n junction between a base and an emitter of the BJT 62 is not equal to the area associated with a p-n junction between a base and an emitter of the BJT 64. Therefore, the BJTs 62, 64 correspond to different voltage differences between the base and the emitter of each BJT 62, 64 when conducting currents with the same magnitude. Operation of the bias circuit 60 is identical to that of the bias circuit 32, and the lengthy description is not repeated for simplicity.

Figure 5:
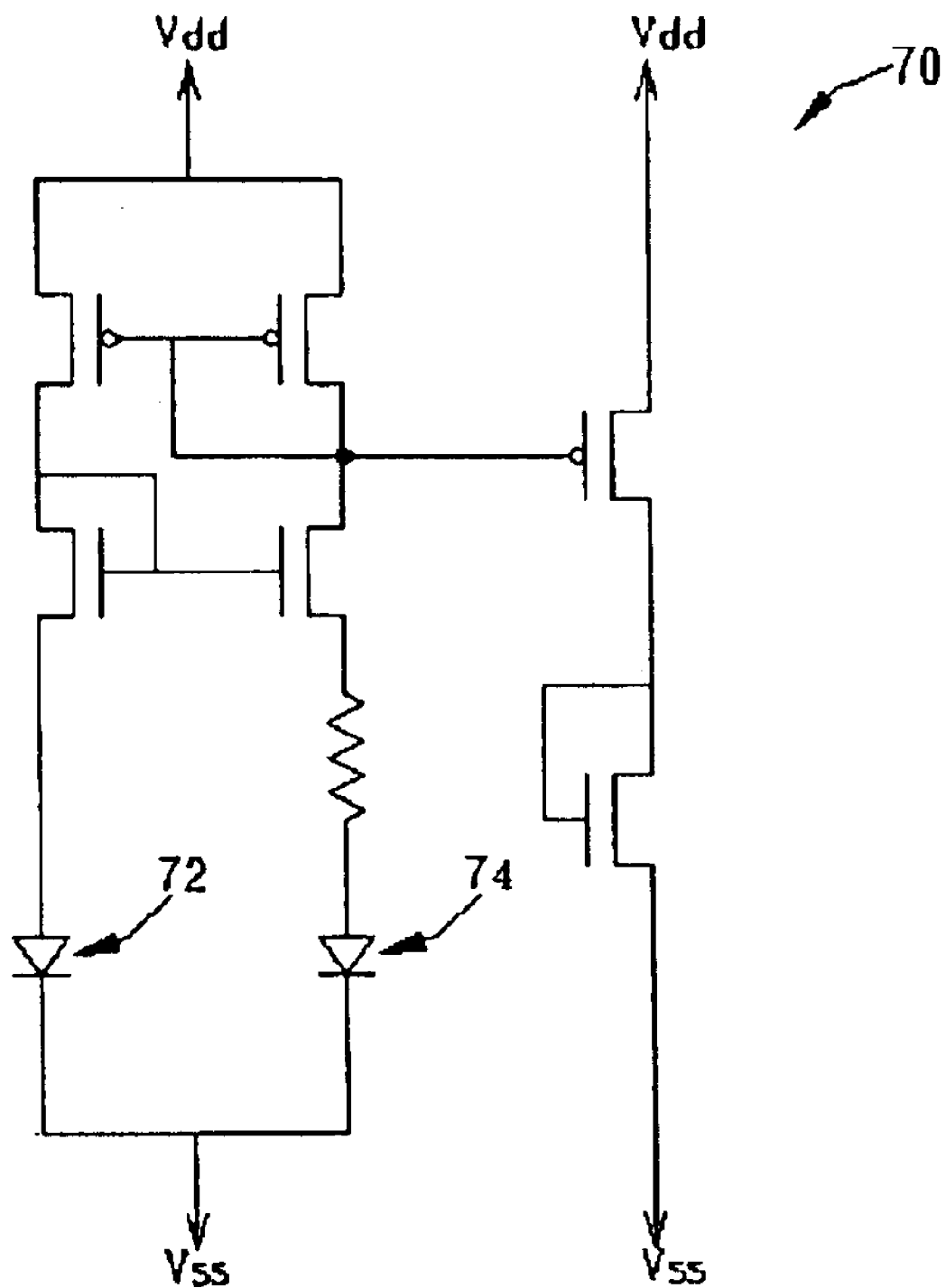
FIG. 5 is a diagram illustrating a second equivalent circuit of the bias circuit shown in FIG. 3.

A bias circuit 70 shown in FIG. 5 is similar to the bias circuit shown in FIG. 3. The only difference is that the bias circuit 70 adopts diodes 72, 74 to substitute for the p-n-p BJTs 50, 52 originally used in the bias circuit 32. The area associated with a p-n junction of the diode 72 is not equal to the area associated with a p-n junction of the diode 74. Therefore, the diodes 72, 74 correspond to different voltage differences when conducting currents with the same magnitudes. Operation of the bias circuit 70 is identical to that of the bias circuit 32, and the lengthy description is not repeated for simplicity.

Figure 6:
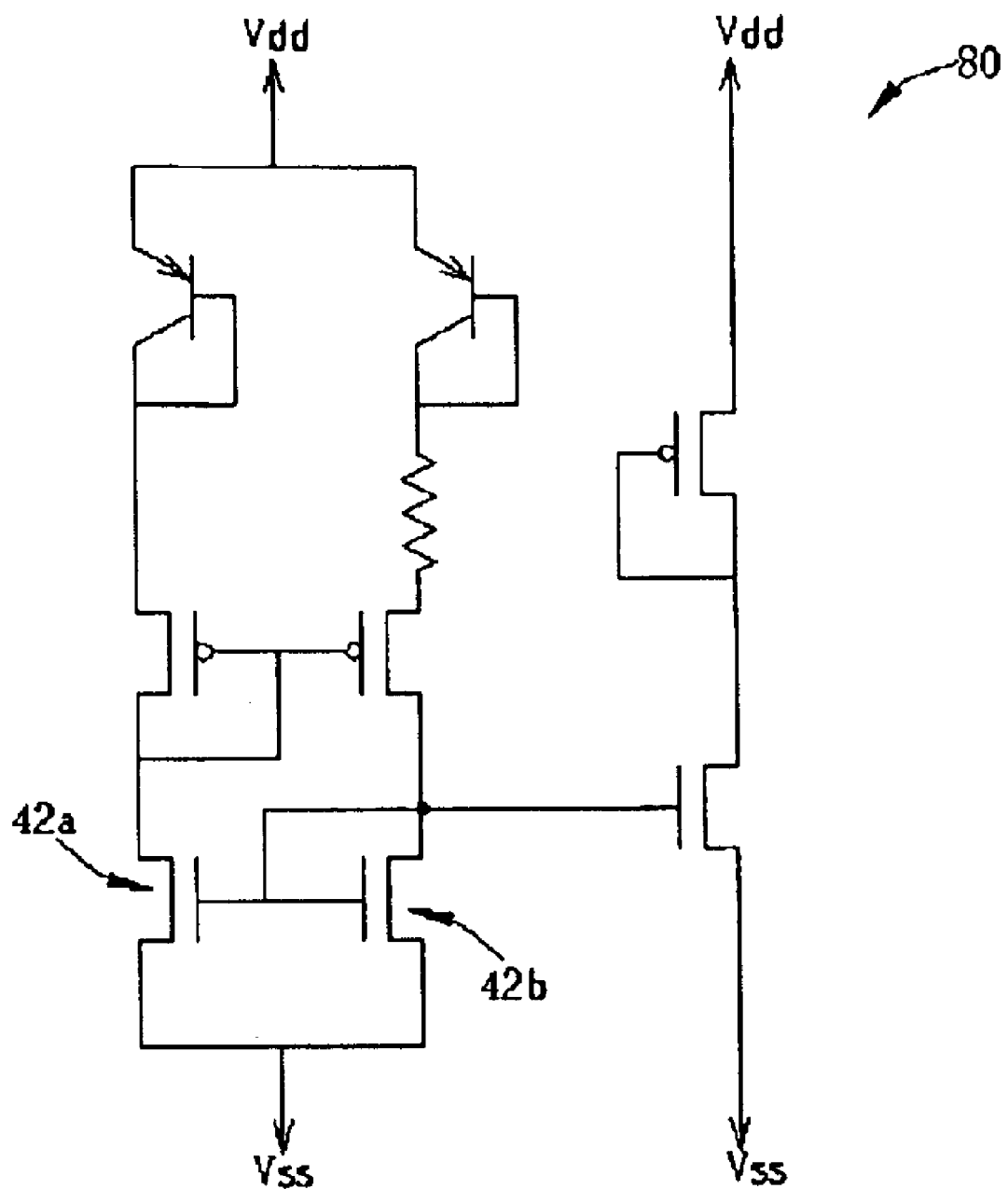
FIG. 6 is a diagram illustrating a third equivalent circuit of the bias circuit shown in FIG. 3.
Figure 7:
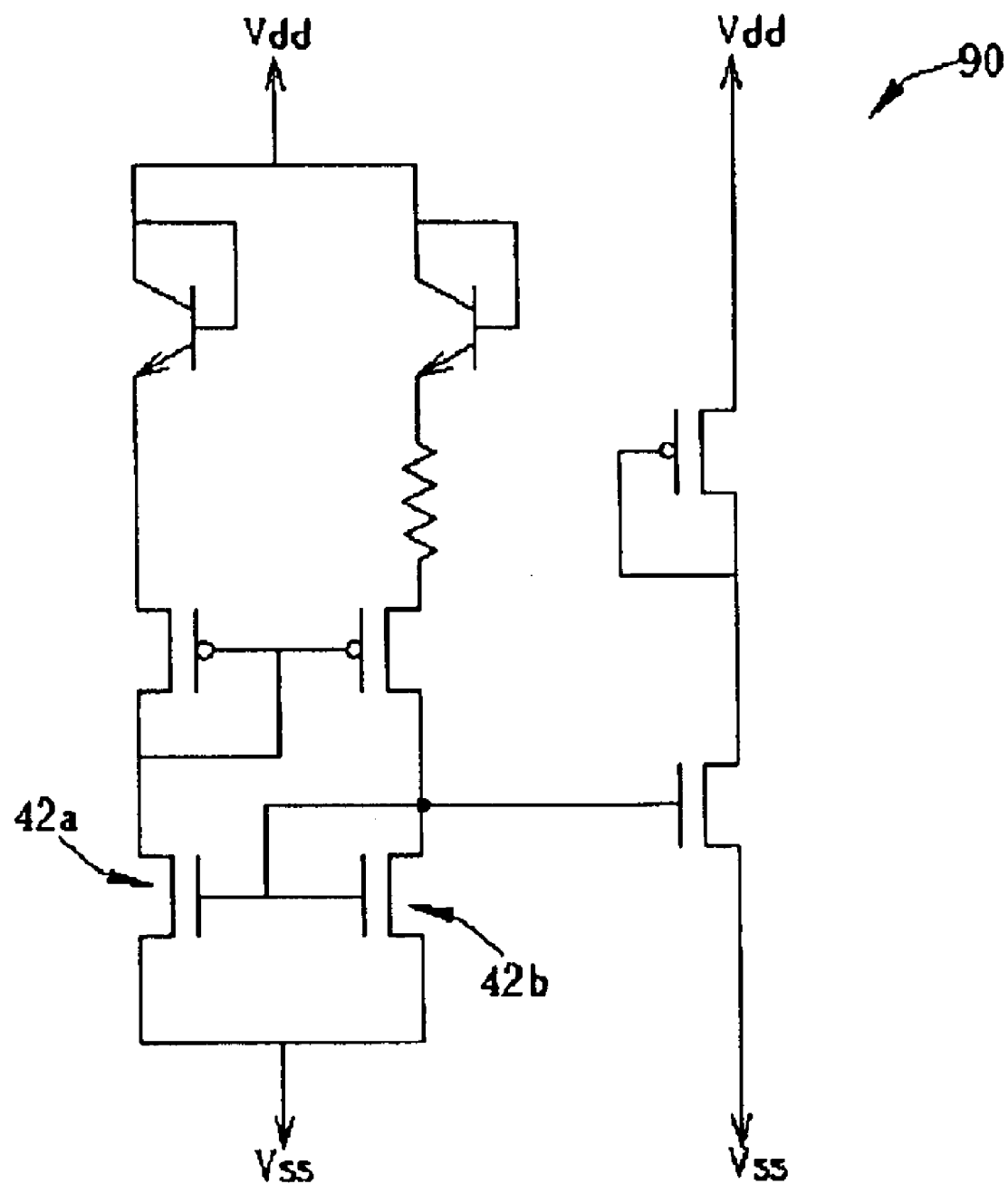
FIG. 7 is a diagram illustrating a fourth equivalent circuit of the bias circuit shown in FIG. 3.
Figure 8:
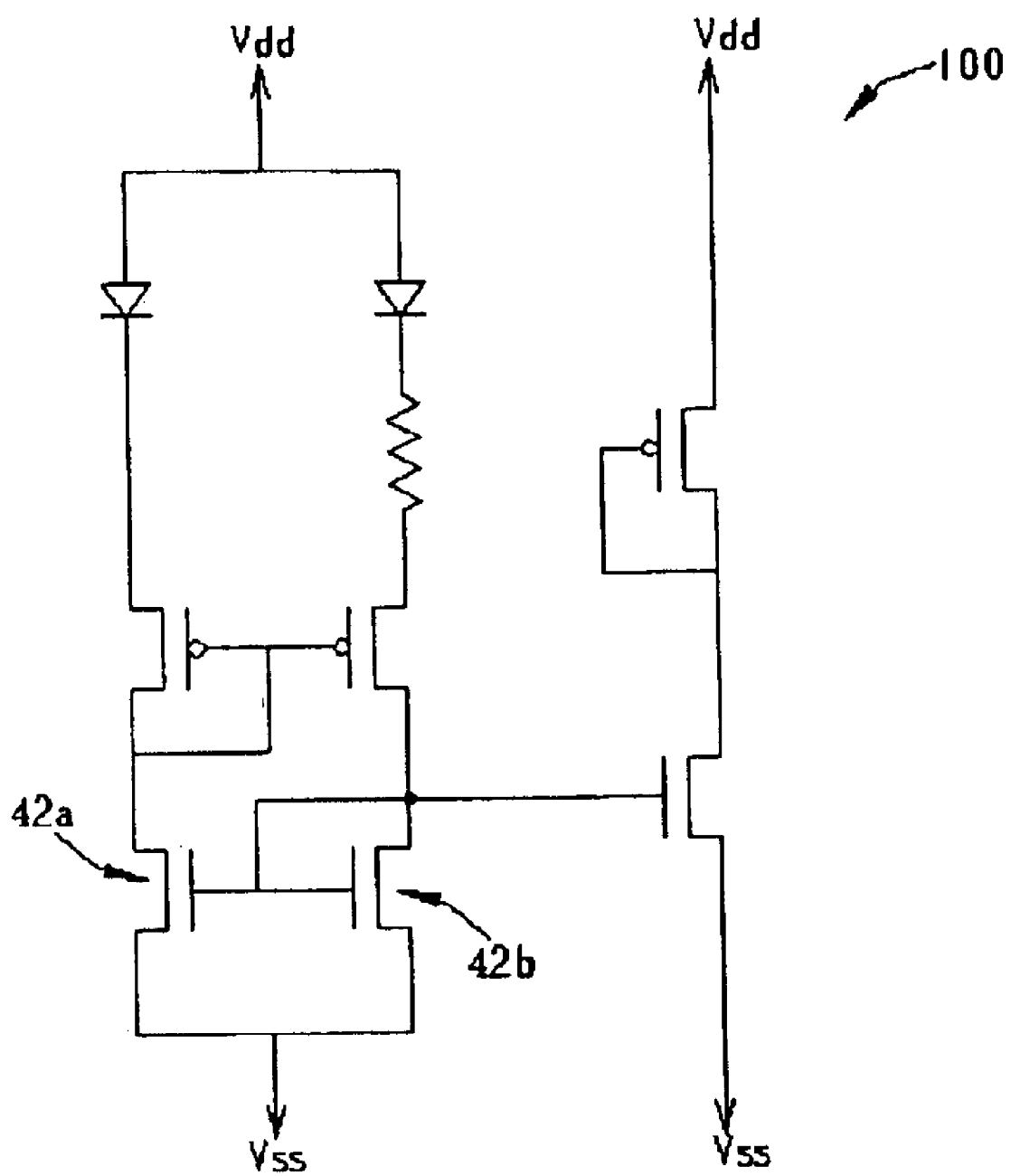
FIG. 8 is a diagram illustrating a fifth equivalent circuit of the bias circuit shown in FIG. 3.

The bias circuits 80, 90, 100 individually illustrated in FIG. 6, FIG. 7, and FIG. 8 are respectively similar to the bias circuits 32, 60, 70 individually shown in FIG. 3, FIG. 4, and FIG. 5. Each of the bias circuits 80, 90, 100 mainly alters a connection between the voltage sources Vdd, Vss and the transistors. For instance, the voltage source Vdd is electrically connected to the transistors 42a, 42b within each of the bias circuits 32, 60, 70. However, with regard to each of the bias circuits 80, 90, 100, the voltage source Vss is electrically connected to the transistors 42a, 42b instead. Operation of the bias circuits 80, 90, 100 are identical to that of the bias circuit 32. Therefore, the lengthy description is not repeated for simplicity.

Please note that the resistor 54 with a positive temperature coefficient is adopted in the preferred embodiment to compensate the above-mentioned temperature effect imposed upon the current value. However, the resistor 54 with a negative temperature coefficient can be used to meet different requirements. For example, if a user needs, the ring oscillator 30 is capable of quickly increasing the frequency of the clock signals F0 when the temperature increases, and is capable of rapidly decreasing frequency of the clock signal F0 when the temperature decreases. Concerning this case, it is necessary to use the resistor 54 with a negative temperature coefficient for achieving the above-mentioned objective. It is noteworthy that the reference currents I3, I4 are totally controlled and set based on the current value I calculated according to the equation (4). Therefore, the magnitudes of the reference currents I3, I4 has nothing to do with transistor characteristics of MOS transistors and voltage levels outputted from voltage sources.

In contrast to the prior art ring oscillator, the claimed ring oscillator makes use of the intrinsic band gap associated with a p-n junction to control a bias current. The claimed ring oscillator adopts two loading units such as diodes or BJTs whose p-n junctions correspond to different areas, then generates the wanted bias current through different voltage differences caused by the unmatched p-n junctions. In addition, a resistor having a positive temperature coefficient is also utilized to compensate variation of the bias current caused by the unsteady temperature. At the same time, the claimed ring oscillator utilizes the bias current and current mirror connections to provide each delay cell with a desired reference current. Therefore, the reference current is not affected even though transistor characteristics of any MOS transistor within the claimed ring oscillator are unsteady. To sum up, the claimed ring oscillator is capable of outputting a stable clock signal.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A bias circuit of a ring oscillator for driving the ring oscillator to output a clock signal with a predetermined period, the ring oscillator comprising a plurality of delay cells, each two adjacent delay cells being cascaded in series with an output port of a leading delay cell and an input port of a following delay cell being connected, an input port of a first delay cell within the delay cells being electrically connected to an output port of a last delay cell within the delay cells, each delay cell comprising:

a first driving transistor for outputting a first bias current to drive a voltage at an output port of the delay cell to correspond to a first logic level;

a second driving transistor for outputting a second bias current to drive the voltage at the output port of the delay cell to correspond to a second logic level; and a switch circuit electrically connected to the first driving transistor and the second driving transistor for deciding the output port of the delay cell is electrically connected to either the first driving transistor or the second driving transistor according to a voltage at an input port of the delay cell;

the bias circuit comprising:

at least a first loading unit comprising at least a p-n junction;

at least a second loading unit comprising at least a p-n junction, an area of the p-n junction of the second loading unit being not equal to an area of the p-n junction of the first loading unit; and a first reference circuit comprising:

a first current mirror circuit electrically connected to the p-n junction of the first loading unit; and a second current mirror circuit symmetric to the first current mirror circuit, the second current mirror circuit being electrically connected to the first current mirror circuit for establishing a current mirror connection used to make the first current mirror circuit and the second current mirror circuit respectively transmit currents with an identical current value to drive the corresponding first loading unit and the second loading unit;

at least a resistor electrically connected between the p-n junction of the second loading unit and the second current mirror circuit; and a second reference circuit electrically connected to the first reference circuit for establishing a current mirror connection used to make a current transmitted by the second reference circuit from the currents transmitted by the first current mirror circuit and the second current mirror circuit correspond to a first predetermined ratio;

wherein the first reference circuit is electrically connected to the first driving transistor of each delay cell for establishing a current mirror used to make the first bias current and the currents transmitted by the first current mirror circuit and the second current mirror circuit correspond to a second predetermined ratio, and the second reference circuit is electrically connected to the second driving transistor of each delay cell for establishing a current mirror used to make the second bias current and the currents transmitted by the first current mirror circuit and the second current mirror circuit correspond to a third predetermined ratio.

2. The bias circuit of claim 1 wherein the area of the p-n junction of the second loading unit is greater than the area of the p-n junction of the first loading unit.

3. The bias circuit of claim 1 wherein a resistance of the resistor increases when temperature of the resistor increases.

4. The bias circuit of claim 1 wherein a resistance of the resistor decreases when temperature of the resistor increases.

5. The bias circuit of claim 1 wherein the first loading unit is a diode.

6. The bias circuit of claim 1 wherein the second loading unit is a diode.

7. The bias circuit of claim 1 wherein the first loading unit is a bipolar junction transistor (BJT).

8. The bias circuit of claim 7 wherein the BJT is a p-n-p BJT, a collector of the BJT is electrically connected to a base of the BJT, and an emitter of the BJT is electrically connected to the first current mirror circuit.

9. The bias circuit of claim 7 wherein the BJT is an n-p-n BJT, and a collector of the BJT is electrically connected to a base of the BJT and the first current mirror circuit.

10. The bias circuit of claim 1 wherein the second loading unit is a bipolar junction transistor (BJT).

11. The bias circuit of claim 10 wherein the BJT is a p-n-p BJT, a collector of the BJT is electrically connected to a base of the BJT, and an emitter of the BJT is electrically connected to the resistor.

12. The bias circuit of claim 10 wherein the BJT is an n-p-n BJT, and a collector of the BJT is electrically connected to a base of the BJT and the resistor.

13. The bias circuit of claim 1 wherein each of the first current mirror circuit and the second current mirror circuit comprises at least a p-channel metal oxide semiconductor (PMOS) transistor and at least an n-channel metal oxide semiconductor (NMOS) transistor.

14. The bias circuit of claim 13 wherein a gate of the NMOS transistor of the first current mirror circuit is electrically connected to a gate of the NMOS transistor of the second current mirror circuit, and a drain of the NMOS transistor of the first current mirror circuit is electrically connected to the gate of the NMOS transistor of the first current mirror circuit.

15. The bias circuit of claim 13 wherein a gate of the PMOS transistor of the first current mirror circuit is electrically connected to a gate of the PMOS transistor of the second current mirror circuit, and a drain of the PMOS transistor of the second current mirror circuit is electrically connected to the gate of the PMOS transistor of the first current mirror circuit.

16. The bias circuit of claim 15 wherein the first driving transistor of each delay cell is a PMOS transistor, and a gate of the PMOS transistor in each delay cell is electrically connected to the gate of the PMOS transistor of the second current mirror circuit.

17. The bias circuit of claim 13 wherein the second reference circuit comprises at least a PMOS transistor and at least an NMOS transistor, and a gate of the PMOS transistor of the second reference circuit is electrically connected to the gate of the PMOS transistor of the second current mirror circuit.

18. The bias circuit of claim 17 wherein a gate of the NMOS transistor of the second reference circuit is electrically connected to a drain of the NMOS transistor of the second reference circuit.

19. The bias circuit of claim 18 wherein the second driving unit of each delay cell is a NMOS transistor, and a gate of the NMOS transistor in each delay cell is electrically connected to the gate of the NMOS transistor of the second reference circuit.

20. The bias circuit of claim 17 wherein the PMOS transistor and the NMOS transistor within each of the first reference circuit and the second reference circuit, and the first driving transistor and the second driving transistor within each delay cell individually operate in a saturation region.

21. The bias circuit of claim 1 wherein the first reference circuit is electrically connected to a first voltage level, an n-type terminal of the p-n junction within each of the first loading unit and the second loading unit is electrically connected to a second voltage level, and the first voltage level is greater than the second voltage level.

22. The bias circuit of claim 1 wherein the first reference circuit is electrically connected to a first voltage level, a p-type terminal of the p-n junction within each of the first loading unit and the second loading unit is electrically connected to a second voltage level, and the first voltage level is less than the second voltage level.

* * * * *